United States Patent
Lacy

(10) Patent No.: US 6,809,031 B1
(45) Date of Patent: Oct. 26, 2004

(54) METHOD FOR MANUFACTURING A RECLAIMABLE TEST PATTERN WAFER FOR CMP APPLICATIONS

(75) Inventor: Michael S. Lacy, Pleasanton, CA (US)

(73) Assignee: Lam Research Corporation, Fremont, CA (US)

(*) Notice: Subject to any disclaimer, the term of this patent is extended or adjusted under 35 U.S.C. 154(b) by 427 days.

(21) Appl. No.: 09/752,610

(22) Filed: Dec. 27, 2000

(51) Int. Cl.$^7$ ............................................. H01L 21/302
(52) U.S. Cl. ....................... 438/690; 438/691; 438/692; 438/697; 438/700
(58) Field of Search .............................. 438/690, 691, 438/692, 697, 700

(56) References Cited

U.S. PATENT DOCUMENTS 3,923,567 A * 12/1975 Lawrence ...................... 438/4
6,276,997 B1 * 8/2001 Li .............................. 451/41
6,613,676 B1 * 9/2003 Yonehara et al. ........... 438/691

* cited by examiner

Primary Examiner—Nadine G. Norton
Assistant Examiner—Binh X. Tran
(74) Attorney, Agent, or Firm—Martine & Penilla, LLP

(57) ABSTRACT

In a method for manufacturing a test pattern wafer, a silicon substrate is provided. A sacrificial oxide layer is deposited over the silicon substrate, and simulated transistor structure test features are fabricated into and on the sacrificial oxide layer. Chemical mechanical polishing characterization is performed using the test pattern wafer which provides data for the characterization of the chemical mechanical polishing. The sacrificial oxide layer is then stripped along with the simulated transistor structure test features, allowing the silicon substrate to be reclaimed and to be used in the fabrication of subsequent test pattern wafers.

18 Claims, 10 Drawing Sheets

METHOD FOR MANUFACTURING A RECLAIMABLE TEST PATTERN WAFER FOR CMP APPLICATIONS

BACKGROUND OF THE INVENTION

1. Field of the Invention

The present invention relates generally to the chemical mechanical polishing (CMP) of substrates, and more particularly, to techniques for manufacturing a reclaimable test pattern wafer to be used in CMP applications.

2. Description of the Related Art

In the fabrication of semiconductor devices, there is a need to perform CMP operations, including polishing, buffing and substrate cleaning. Typically, integrated circuit devices are in the form of multi-level structures. At the substrate level, transistor devices having diffusion regions are formed over and into silicon substrates. In subsequent levels, interconnect metallization lines are patterned and electrically connected to the transistor devices to define the desired functional device. As is well known, patterned conductive layers are insulated from other conductive layers by dielectric materials, such as silicon dioxide. At each metallization level there is a need to planarize metal or associated dielectric material. Without planarization, fabrication of additional metallization layers becomes substantially more difficult due to the higher variations in the surface topography. In other applications, metallization line patterns are formed in the dielectric material, and then metal CMP operations are performed to remove excess metallization, e.g., such as copper.

As transistor device structures become smaller and more complex, the precision required of CMP equipment increases. The CMP industry continues to meet demands with an ever-expanding body of technology and implementation to produce more precise and refined tools. All CMP tools are continually tested and calibrated, or characterized, to evaluate performance of a tool as well as various abrasive and fabrication material properties, and methods of use. By way of example, characterization can include the measurement of rate of removal using a plurality of slurries or different polishing surfaces. Further, characterization includes measurement of removal rates for disparate materials such a oxides and metals to determine or predict end points of processing. The characterization is typically done with a "test" wafer. A test wafer is usually one of a blanket film or a test pattern wafer. Using a test wafer, a CMP tool is used to process a substrate in the same manner as in the actual fabrication of a semiconductor wafer. During the characterization operation, the process, materials, tool, and the like are evaluated, measured, and modified to achieve more precise control of the CMP process.

A test pattern wafer is fabricated in much the same manner as a production wafer. In order to accurately characterize the CMP process, the test pattern wafer must present the same or similar structures, the structures must be constructed of essentially the same materials, and the structures must be in the same or similar geometric arrangements as those of production wafers. FIG. 1 shows a cross section of a typical prior art test pattern wafer 10 used in CMP applications. FIG. 1 shows a test pattern wafer 10 that replicates a shallow trench isolation (STI) structure. A silicon wafer 12 is etched to create trenches 15 in the silicon. A pad oxide layer 14 is fabricated over the silicon wafer 12, and a silicon nitride (SiN) layer is fabricated over the pad oxide layer 18 to form a simulated gate, or gate-type structure. In one embodiment, even the source/drain regions 18 are created in the simulated gate structure. Finally, a high density plasma (HDP) fill 20 is deposited over the entire structure just as in the fabrication of a production wafer. The HDP fill is then removed by CMP to expose a SiN film which is protecting the surface of the gate structure, leaving the trench 15 filled to create the basic STI structure.

It should be appreciated that a test wafer structure in the illustrated example is processed in essentially the same manner as a production wafer. The test pattern wafer is etched to define the STI and gate structures, pad oxide and SiN layers are fabricated, and the structure is deposited with HDP oxide fill. FIG. 1 illustrates a typical single structure used in CMP characterization. A test pattern wafer typically contains a plurality of dies or simulated microchip structures that vary in complexity and density from low density concentration of the structures to very high density concentration of structures across a single test wafer. Once the CMP characterization test of the wafer is completed, the wafer, no longer useful for production or test purposes, is scrapped.

The silicon used for wafers in semiconductor manufacture is plentiful, but it is not inexpensive. Production wafers result in a plurality of microchip devices and generate a large return on the investment of time and material. Test wafers, on the other hand, do not result in structures generating monetary return, but require essentially the same investment of time and material to create the precise structures used in CMP characterization. Test pattern wafer structures such as that illustrated in FIG. 1 require etching of the silicon substrate, a complex, precision operation. Test pattern wafers further require multiple fabrication steps to create a plurality of structures in increasing densities on the surface of the silicon substrate. Test pattern wafers are therefore expensive to produce, expensive to procure, and are scrapped after a single use. There is little incentive for the production of test pattern wafers with such limited utility and return, but there remains a constant demand for test pattern wafers by semiconductor fabrication equipment manufacturers, as well as manufacturers of semiconductors using CMP tools. The constant demand results in an ever-increasing cost for test pattern wafers from dwindling numbers of suppliers.

What is needed is a method for manufacturing a reclaimable test pattern wafer for CMP applications. The method should include a way to fabricate a test pattern wafer that is suitable for CMP characterization, and then can be reclaimed to create another test wafer for another CMP characterization.

SUMMARY OF THE INVENTION

Broadly speaking, the present invention fills these needs by providing a method for manufacturing a test pattern wafer to be used to characterize CMP processes. The test pattern wafer includes a sacrificial oxide layer over a silicon substrate enabling the fabrication of test pattern structures in and over the sacrificial oxide which is easily etched and otherwise fabricated, and then easily removed from the silicon substrate following the CMP characterization. In this manner, the sacrificial oxide layer preserves the structure and integrity of the silicon substrate, and provides for reclaiming the substrate for subsequent test pattern wafer fabrication. The present invention can be implemented in numerous ways, including as a process, an apparatus, a system, a device, or a method. Exemplary embodiments of the present invention are described below.

In accordance with one aspect of the invention, a method for fabricating a test pattern wafer to be used in CMP characterization operations is provided. The method includes providing a silicon substrate and then depositing a layer of oxide over a surface of the substrate. The method further provides for defining a test pattern structure and then fabricating the test pattern structure over the layer of oxide. The method then includes characterizing a CMP process using the test pattern wafer, and then removing the test pattern structure and layer of oxide layer from the silicon substrate.

In accordance with another aspect of the invention, a method is provided for reclaiming a silicon substrate for repeated chemical mechanical polishing characterization. The method includes forming a sacrificial oxide layer over the silicon substrate and then forming test features in the sacrificial oxide layer. Chemical mechanical polishing characterization is performed using the test features which provides data regarding chemical mechanical polishing performance. The method then provides for the stripping of the sacrificial oxide layer including the test features which enables the reuse of the silicon substrate for repeated chemical mechanical polishing characterization.

In accordance with yet another aspect of the invention, a method for reclaiming a substrate for repeated chemical mechanical polishing characterization is provided. The method includes forming a sacrificial oxide layer over the substrate. The sacrificial oxide layer is configured to act as a silicon substrate. Test features are formed into the sacrificial oxide layer which are designed to simulate transistor structures, and the test features are then used in the characterization of a chemical mechanical polishing process to provide data regarding the performance of the chemical mechanical polishing over the simulated transistor structures. The sacrificial oxide layer and the test features are then stripped from the substrate enabling reuse of the substrate for repeated chemical mechanical polishing characterization without damage to the substrate.

In accordance with a further aspect of the invention, a method for reclaiming a substrate in chemical mechanical polishing characterization of simulated transistor structures is provided. The method includes forming a sacrificial layer over the substrate which is configured to structurally simulate a silicon substrate. Simulated transistor structures are formed using the sacrificial layer and then a chemical mechanical polishing characterization of the simulated transistor structures is performed to provide data regarding the chemical mechanical polishing performance over the simulated transistor structures. The sacrificial layer including the simulated transistor structures is then stripped enabling the reclaiming of the substrate for repeated chemical mechanical polishing characterization. The reclaiming of the substrate enables the forming of additional layers, the forming of additional simulated transistor structures, the performing of additional chemical mechanical polishing characterization, and the stripping of the additional layers including the additional simulated transistor structures.

In accordance with still a further aspect of the invention, a method for fabricating a test pattern wafer for repeated CMP characterization is provided. The method includes forming a sacrificial oxide layer over a silicon substrate. The sacrificial oxide layer is configured to act as the silicon substrate, and test features are formed in the sacrificial oxide layer which simulate semiconductor structures. The method further includes performing CMP characterization of the test features which provides data regarding CMP performance over the simulated semiconductor structures. The method also includes stripping the sacrificial oxide layer including the test features from the test pattern wafer to enable reuse of the silicon substrate for subsequent fabrication of a new test pattern wafer, and repeated CMP characterization without damage to the silicon substrate.

The advantages of the present invention are numerous. One notable benefit and advantage of the invention is the reduction in cost of CMP characterization and fabrication in general. Because test pattern wafers yield no return on the investment of time and resource in the form of a marketable semiconductor device, they tend to be expensive to produce, expensive to procure, and are scrapped after a single use. The present invention enables the reclaiming of silicon substrates in such a manner that the very industries that require the test pattern substrates for CMP characterization can easily produce the test pattern substrates they require. This significantly reduces the cost of production, and almost eliminates the cost of procurement.

Another benefit is ease of manufacture of test pattern wafers in accordance with one embodiment of the present invention. In the fabrication of production STI structures, the STI trenches are typically etched into a silicon substrate. The present invention provides for STI trenches to be etched into a sacrificial oxide layer. The process of etching oxide is notably less complex than that of etching silicon. The less complex process of making test pattern wafers enables the very consumers of test pattern wafers to easily manufacture test pattern wafers.

Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF EXEMPLARY EMBODIMENTS

An invention for a method of manufacturing a reclaimable test pattern wafer for CMP applications is disclosed. In preferred embodiments, the method includes the manufacture of a reclaimable test pattern wafer suitable for STI semiconductor structure fabrication, as well as tungsten plug structures, copper interconnect structures, interlayer dielectric (ILD) structures, and the like, with a layer of oxide deposited over the silicon substrate prior to the fabrication of the desired structures. The oxide provides a medium that is easily etched to create STI and metal interconnect structures, and is easily removed following the CMP characterization in order to fabricate another test pattern wafer.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 2A:
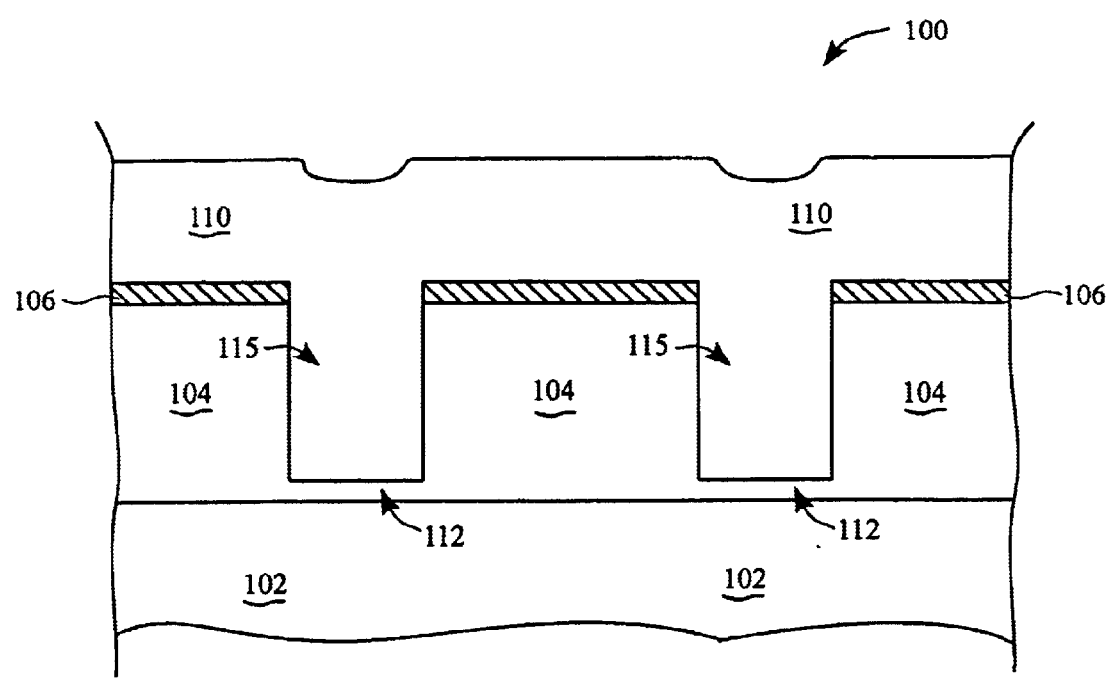
FIG. 2A shows a cross section of a test pattern wafer in accordance with one embodiment of the present invention.

FIG. 2A shows a cross section of a test pattern wafer 100 in accordance with one embodiment of the present invention. The illustrated test pattern structures are STI structures. The test pattern wafer 100 is fabricated on a silicon substrate 102. Before any semiconductor device test pattern structures are fabricated, a sacrificial oxide layer 104 is deposited over the entire silicon substrate 102. The sacrificial oxide layer 104 serves in the same capacity as the silicon substrate of a production wafer, with the features of the test pattern structures fabricated in and on the oxide 104. As will be described in greater detail below, following the CMP characterization with the test pattern wafer 100, the sacrificial oxide layer 104 and fabricated test pattern structures are stripped from the silicon substrate 102 to provide for the reclaiming of the substrate 102 to fabricate another test pattern wafer 100.

In one embodiment, the oxide layer 104 is deposited to a depth of about 2000 Å–5000 Å. The exact depth of the oxide 104 is determined based upon such factors as the type of structure to be fabricated, the type of characterization to be performed, the materials selected, and the like. By way of example, if an STI structure with a 0.25 $\mu$ trench is to be fabricated, the oxide would be deposited to a depth of about 4000 Å. If an STI structure with a 0.10 $\mu$ trench is to be fabricated, the oxide might be deposited to a depth of about 3000 Å.

In a further example, if an ILD structure with pattern features ranging from about 0.25 $\mu$ to greater than 500 $\mu$ is to be fabricated, the oxide might be deposited to a depth of about 7000 Å. In yet a further example, if a metal damascene structure with pattern features ranging from about 0.25 $\mu$ to greater than 50 $\mu$ is to be fabricated, the oxide might be deposited to a depth of about 5000 Å.

Once the sacrificial oxide 104 has been deposited over the entire silicon substrate 102, STI structures are fabricated in accordance with known processes. In one embodiment, gate-type structures are fabricated of one or more layers of SiN 106, and trenches 115 are etched into the oxide 104. A skin layer 112 of oxide can be left remaining over the silicon substrate 102 to preserve the integrity and structure of the silicon substrate 102. In one embodiment, the skin layer 112 is about 100 Å–500 Å in depth. The entire STI structure is then covered with a layer of HDP fill 110 (e.g., oxide) in accordance with known semiconductor fabrication processes.

In one embodiment of the present invention, the HDP fill 110 completes the basic structure of the test pattern wafer 100. The CMP of the HDP fill 110, also known as HDP overburden, provides the desired characterization of the CMP process. The characterization includes, by way of example, measurement and evaluation of the removal of the HDP fill 110 and post-CMP measurement of the thickness of the SiN layer 106. Additionally, the precision of the post-CMP planarization is evaluated. As will be described below in reference to FIGS. 3B and 3C, the characterization is performed on test pattern wafers constructed with a plurality of varying pattern densities, complexities, and geometries just as production wafers are designed and constructed of varying pattern densities, complexities, and geometries. As used herein, density refers to the number of individual structures within a given area, complexity refers to the number of layers or division of layers within a single structure, and geometry refers to the arrangement or orientation of a structure or structures within a given area or defining an identifiable simulated transistor structure.

Figure 2B:
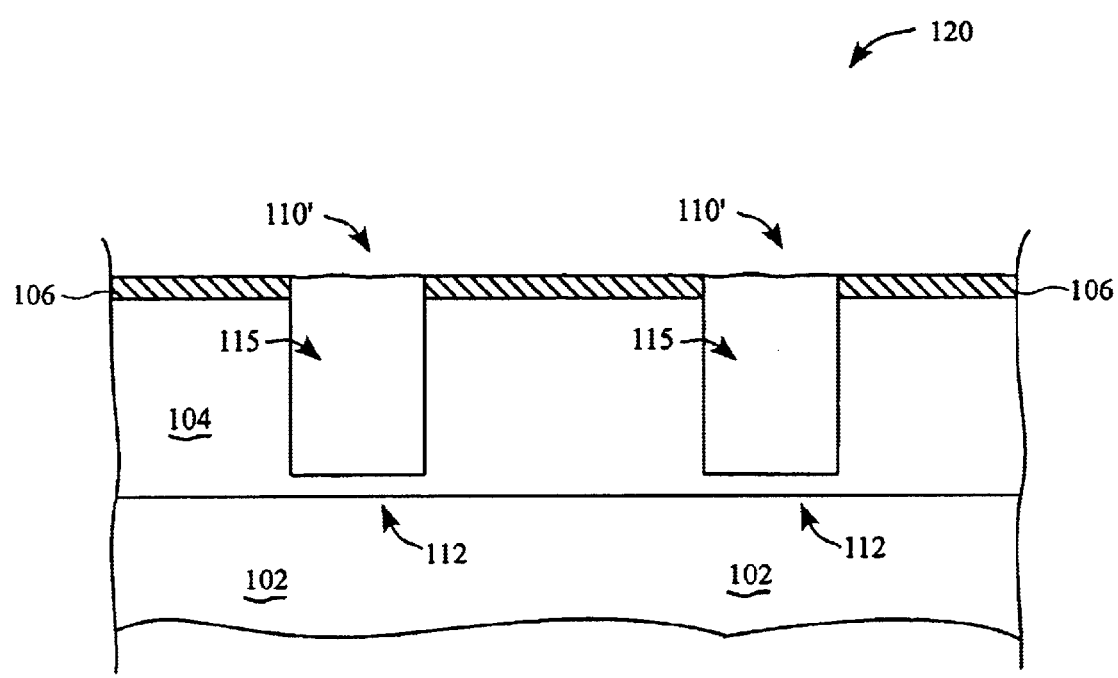
FIG. 2B shows a test pattern wafer after CMP of the HDP fill in accordance with one embodiment of the present invention.

FIG. 2B shows a test pattern wafer 120 after CMT of the HDP fill in accordance with one embodiment of the present invention. The remaining planarized surface of the test pattern wafer 120 includes an exposed SiN layer 106 and STI trenches 115 filled with HDP 110' and planarized to the same level as the SiN layer 106. As described above, the CMP characterization includes measurement of the post-CMP thickness of the SiN layer 106, the rate of removal of the HDP fill, and the smoothness or degree of planarization of the surface of the test wafer 120. The characterization includes evaluation of a plurality of structures in varying densities and geometries as described in greater detail below.

Figure 2C:
FIG. 2C illustrates the reclaiming of a test pattern wafer in accordance with the invention.

FIG. 2C illustrates the reclaiming of a test pattern wafer 130 in accordance with the invention. After the fabrication of the test pattern structures and the characterization of the CMP tool, process, or materials, the sacrificial oxide layer 104 (FIG. 2A) with the fabricated test pattern structures is stripped from the substrate 102. As can be appreciated, the sacrificial oxide layer 104 (FIG. 2A) provides a medium in which features are etched, fabricated, or otherwise processed, while protecting the substrate integrity and structure. Once the CMP characterization is performed with a test wafer in accordance with the invention, the test features and oxide layer are etched or otherwise removed from the substrate, allowing the reclaiming of the wafer 130 for subsequent deposition of oxide and fabrication of test pattern structures.

Figure 2D:
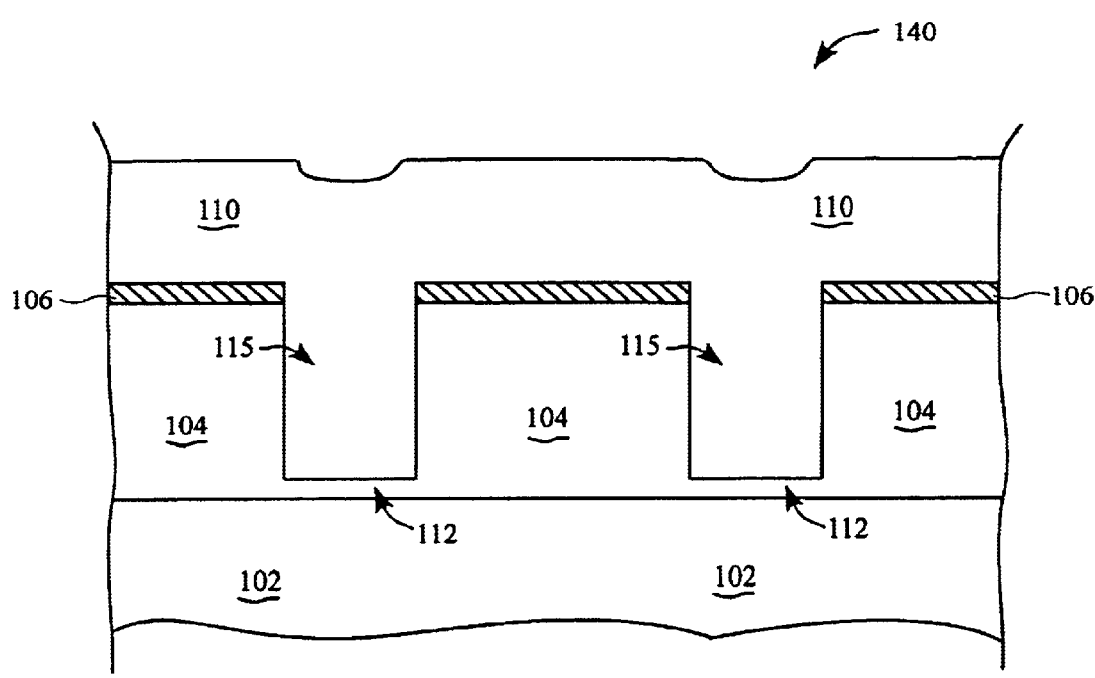
FIG. 2D illustrates the completed cycle of reclaiming a test pattern wafer in accordance with one embodiment of the invention.

FIG. 2D illustrates the completed cycle of reclaiming a test pattern wafer. FIG. 2D shows a cross section of a subsequent test pattern wafer 140, another STI test pattern wafer 140, fabricated on a silicon substrate 102 that has been reclaimed after fabrication of a previous test pattern wafer (FIG. 2A). FIG. 2D shows a silicon substrate 102 over which an oxide layer 104 has been deposited. STI trenches 115 have been etched into the oxide layer 104, leaving a skin 112 of oxide between the substrate 102 and the bottom of the trench 115. An SiN layer 106 has been fabricated to simulate a gate region, and the entire structure has been filled with HDP oxide fill 110. The form and function of the subsequent test pattern wafer 140 is identical to the previous test pattern wafer 100 described above in reference to FIG. 2A.

Figure 1:
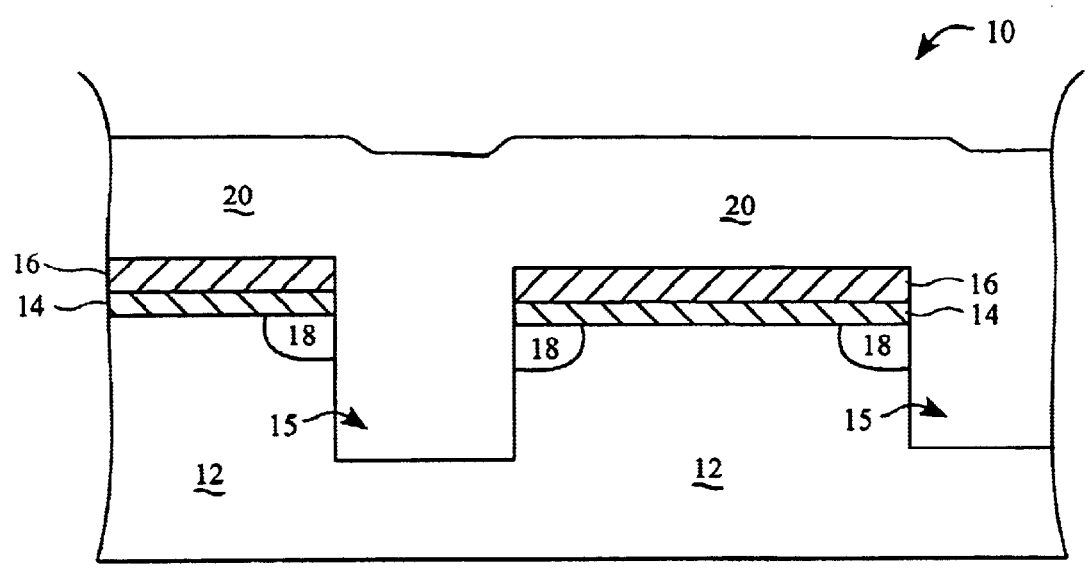
FIG. 1 shows a cross section of a typical prior art test wafer used in CMP applications.
Figure 3A:
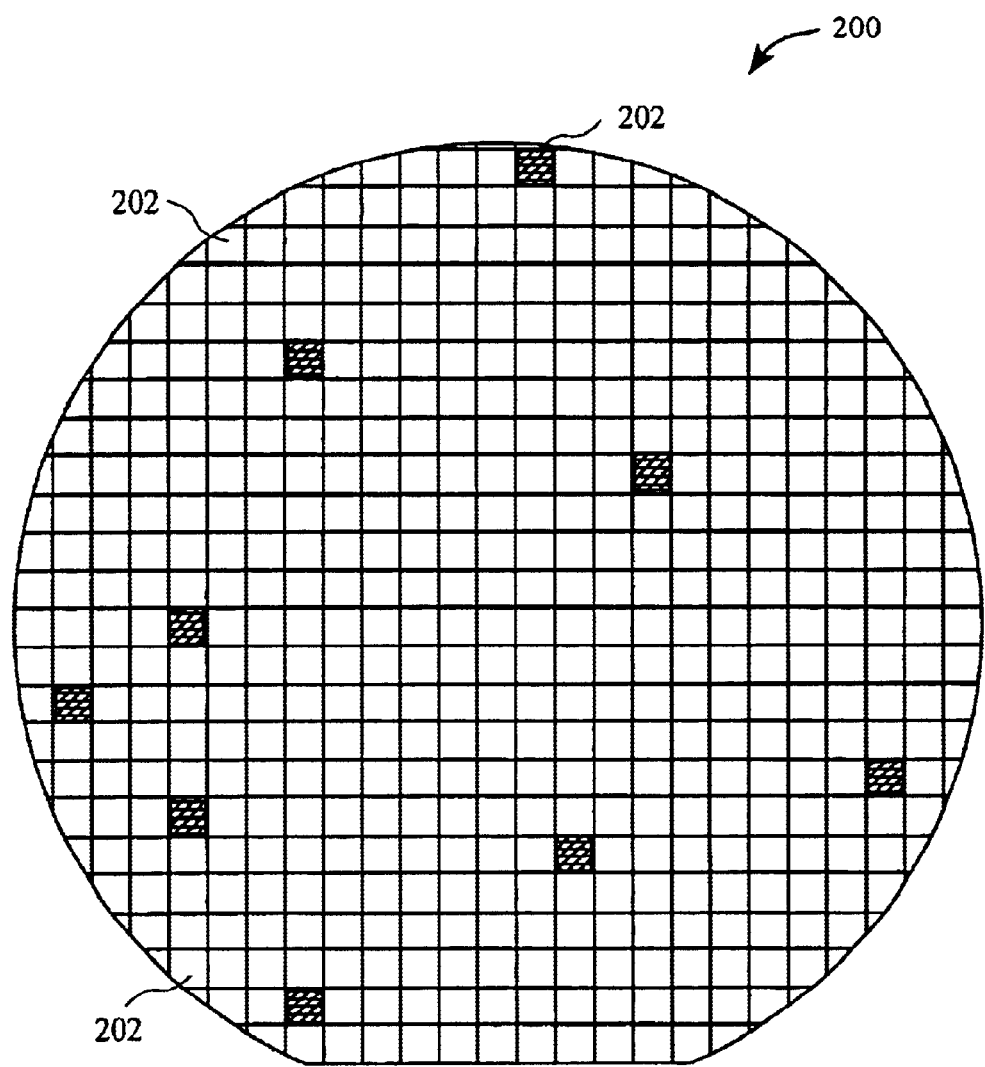
FIG. 3A shows a representative test pattern wafer in accordance with one embodiment of the present invention.

FIG. 3A shows a representative test pattern wafer 200 in accordance with one embodiment of the present invention. The test pattern wafer 200 includes a plurality of dies 202 fabricated on the surface of the substrate 102 as described in reference to FIG. 1. Each of the individual dies 202 includes a plurality of structures of varying densities and arrangements to provide an accurate representation of the various structures typically fabricated on a single production wafer. The test pattern wafer 200 thus provides an accurate representation of a typical production wafer with which to conduct CMP characterization.

Figure 3B:
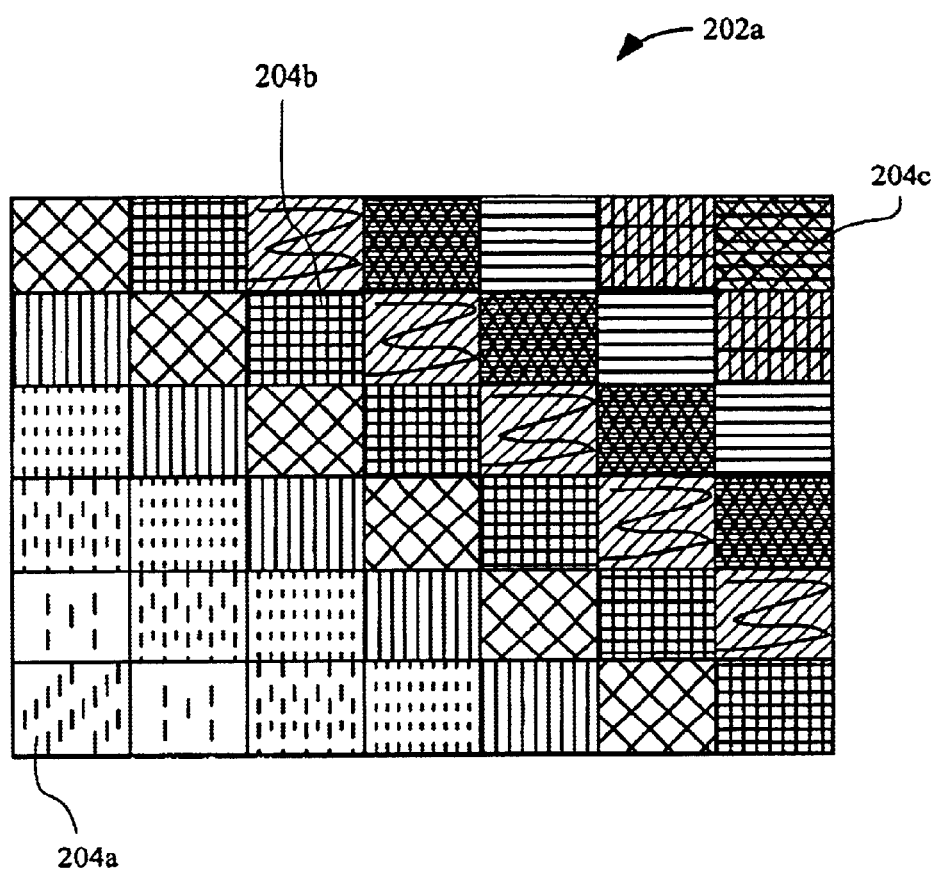
FIG. 3B is a single test pattern die in accordance with one embodiment of the invention.

FIG. 3B is a single test pattern die 202a in accordance with one embodiment of the invention. The test pattern die 202a includes a plurality of test pattern regions 204a, 204b, 204c, fabricated in the single test pattern die 202a. In FIG. 3B, the test pattern regions 204a, 204b, 204c, are fabricated such that the density of the structures increases from the lower left corner of the test pattern die 202a at test pattern region 204a to the upper right corner of the test pattern die 202a at test pattern region 204c. In the embodiment shown in FIG. 3B, the increasing density of the test pattern regions 204a, 204b, 204c, provides a test pattern die 202a to characterize a CMP operation ranging from the least dense of structures to the most complex of structures. The test pattern regions 204a, 204b, 204c, identified by number in FIG. 3B are only representative of the plurality of regions fabricated across the single test pattern die 202a, and shown as squares in the test pattern die 202a of FIG. 3B. Moving from the least dense test pattern 202a, the test pattern regions are increasingly more dense to the most dense test pattern region 202c.

Figure 3C:
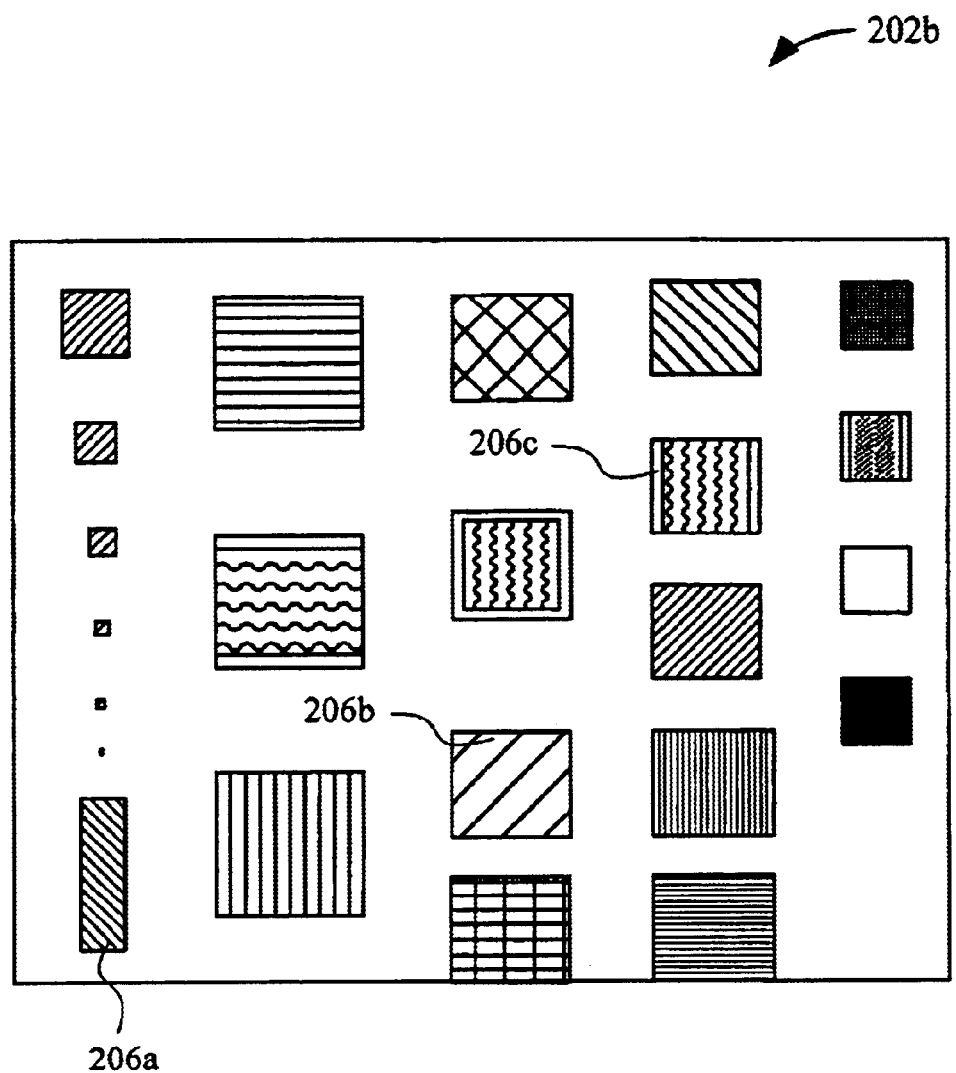
FIG. 3C shows a test pattern die in accordance with another embodiment of the present invention.

FIG. 3C shows a test pattern die 202b in accordance with another embodiment of the present invention. The test pattern die 202b in FIG. 3C includes a plurality of test pattern structures that vary in size, density, and arrangement of individual structures. Representative test pattern structures 206a, 206b, and 206c illustrate the varying size, arrangement, and complexity of the test pattern structures fabricated on a single test pattern die 202b. As described above, the plurality of structures, arrangements, and complexities provide a broad test pattern environment with which to characterize the CMP process.

The representative dies shown in FIGS. 3B and 3C are included in the plurality of dies that can be fabricated on a single test pattern wafer 200 (FIG. 3A) in one embodiment of the invention. The test pattern structures are representative of the varying complexity of semiconductor structures fabricated for production, and provide a comprehensive environment for precision characterization of CMP processes, operations, materials, and tools. The present invention provides a layer of oxide over the silicon substrate, and provides that the test pattern structures are fabricated in and over the oxide layer. The fabrication process of etching STI trenches, in one example, is less complex than prior art etching of STI trenches into the silicon substrate, and preserves the structure and integrity of the silicon substrate. Once a test pattern wafer has been fabricated and characterization using the test pattern wafer is completed, the test pattern wafer can be stripped back to the silicon substrate in accordance with known oxide etch techniques, the substrate thus reclaimed, and a subsequent test pattern wafer fabricated. The present invention thus significantly reduces scrap of silicon substrates and reduces cost of production.

In alternative embodiments of the invention, a plurality of semiconductor structures and techniques are fabricated and presented for CMP characterization in test pattern wafers. It should be appreciated that STI structures are one embodiment of the present invention, but not an exclusive application. FIGS. 2A–3C are used to thoroughly illustrate the present invention, and the embodiments implemented with STI structures provide comprehensive examples.

Figure 4A:
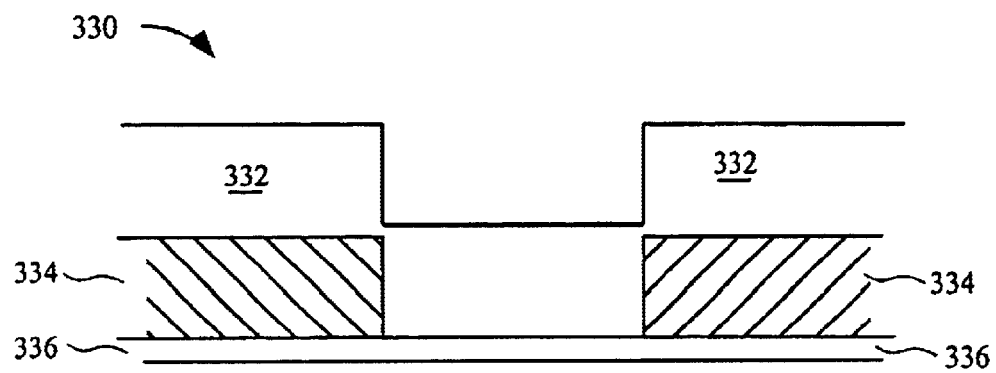
FIG. 4A shows a test pattern wafer for use in the characterization of the CMP of ILD structures in accordance with one embodiment of the present invention.
Figure 4B:
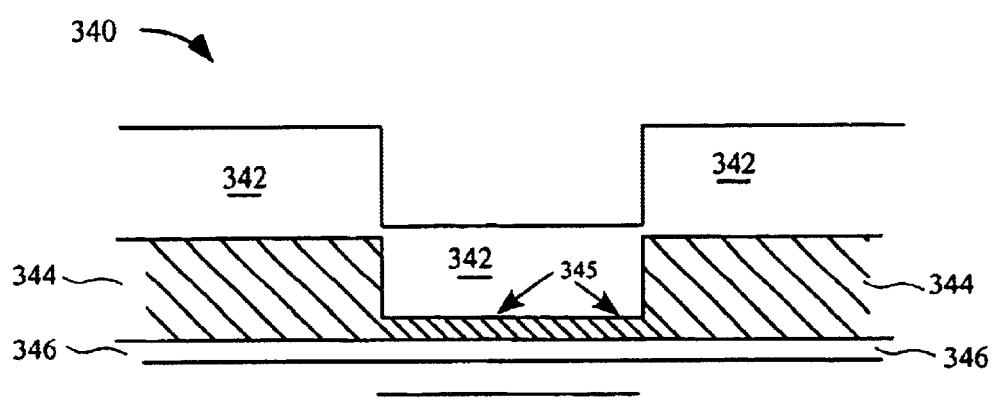
FIG. 4B shows a test pattern wafer for use in the characterization of the CMP of metal damascene structures in accordance with an embodiment of the invention.

FIGS. 4A and 4B illustrate alternate embodiments of the present invention. FIG. 4A shows a test pattern wafer 330 for use in the characterization of the CMP of ILD structures in accordance with one embodiment of the present invention. The test pattern wafer 330 in FIG. 4A includes a silicon substrate 336 over which has been deposited a layer of sacrificial oxide 334. The sacrificial oxide 334 is patterned and etched with a test pattern that simulates a metal pattern of a device wafer. A conformal oxide overcoat 332 is deposited over the structure to a desired thickness, simulating the ILD layer. The ILD test pattern wafer 330 is designed to present ILD topography without deposition and etch of any metal layer.

FIG. 4B shows a test pattern wafer 340 for use in the characterization of the CMP of metal damascene structures in accordance with an embodiment of the invention. Typically, such structures are fabricated of copper or tungsten. The test pattern wafer 340 in FIG. 4B includes a silicon substrate 346 over which has been deposited a layer of sacrificial oxide 344. The sacrificial oxide 344 is patterned and etched with a test pattern, leaving a minimal oxide layer 345 over the silicon substrate 346 below the deepest recesses of any patterned features. Such a minimal oxide layer 345 might have a thickness of about 10000 Å. The patterned sacrificial oxide layer 344 is then deposited with the desired metal stack 342 for the desired test pattern structure.

The alternate embodiments of test pattern wafers are all reclaimable as the structures and techniques are fabricated and presented in a layer of sacrificial oxide over the silicon substrate as described above and illustrated with STI structures. Alternative embodiments include fabrication of test pattern wafers to present structures simulating tungsten plugs, copper interconnects, interlayer dielectrics without aluminum, and the plurality of structures fabricated and processed with CMP.

Figure 5:
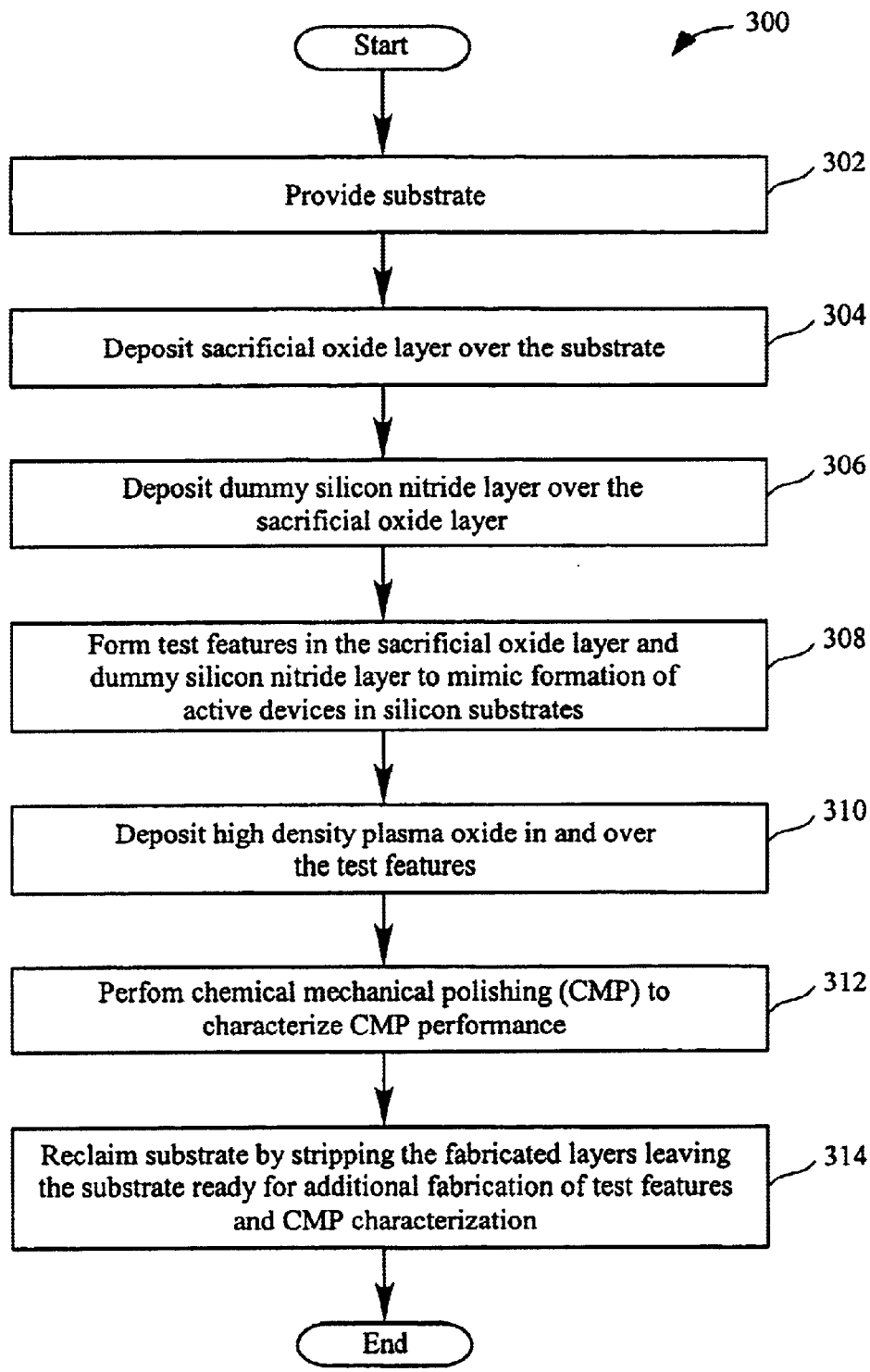
FIG. 5 is a flow chart diagram illustrating the method operations performed in manufacturing a reclaimable test pattern wafer for CMP applications in accordance with one embodiment of the present invention.

FIG. 5 is a flow chart diagram 300 illustrating the method operations performed in manufacturing a reclaimable test pattern wafer for CMP applications in accordance with one embodiment of the present invention. As described above, the embodiment illustrated with the flow chart 300 uses STI structures, but is generally modifiable using known fabrication operations and techniques to fabricate test pattern wafers for a plurality of CMP applications. The method begins with operation 302 in which a substrate is provided. Typically, the substrate is a silicon substrate manufactured in accordance with known semiconductor wafer manufacturing methods and processes.

The method advances to operation 304 in which a sacrificial oxide layer is deposited over the surface of the substrate. The oxide is deposited over the entire surface of the substrate, and in one embodiment, is deposited to a depth of about 2000 Å–5000 Å. The sacrificial oxide layer provides a medium or layer in and on which to fabricate test pattern features while preserving the structure and integrity of the substrate.

Next, in operation 306, the method includes depositing a dummy SiN layer over the sacrificial oxide layer. In one embodiment of the invention, the test pattern features include simulated gate structures. The dummy SiN layer simulates the uppermost layer of a simulated gate structure. Of course, other layers can be added to simulate other structures.

In operation 306, test features are fabricated in the sacrificial oxide layer and dummy SiN layers of the test pattern wafer. By way of example, test features might include STI trenches and simulated transistor gate regions. The test features are fabricated in varying densities, sizes, complexities and geometries, typically in test pattern dies fabricated over the surface of the substrate. The test features are configured to present the same structures as would be presented in a production wafer in order to provide the most accurate characterization of CMP equipment, processes and materials.

The method advances to operation 310 in which the HDP fill is deposited over the test features. In one embodiment, the HDP fill represents the final step in the test pattern wafer fabrication process. The HDP fill is deposited to fill the STI trench structures, and typically blankets the entire test pattern wafer. In alternative embodiments, copper, tungsten, TEOS, and the like might be deposited at this point to fabricate additional features. Following the depositing of the HDP fill, the method advances to operation 312 and the CMP characterization.

An initial step in the CMP characterization is the CMP of the HDP fill. As in the fabrication of a production wafer, the surface of the wafer is planarized using a CMP process. The HDP fill is removed from over the dummy SiN simulated gate structures, exposing the upper surface of the SiN and leveling the HDP-filled STI trench structures. CMP characterization includes the evaluation of the post-CMP thickness of the SiN layers, the removal rate of the HDP fill, the precision of the planarization, and the like, in the plurality of structures, densities, complexities, and geometries of the test features of the test pattern wafer.

The method concludes with operation 314 in which, following the CMP characterization, the test pattern wafer is reclaimed for subsequent use by stripping the fabricated layers and leaving the substrate. The sacrificial oxide layer in and over which the test features were fabricated, preserves the structure and integrity of the substrate. When the characterization processes are complete, the oxide layer and fabricated structures are easily removed by, for example, HF wet-back etching, or a similar process, and the intact substrate remains. Subsequent test pattern wafers can be fabricated on the reclaimed wafer in a similar manner as described, and the method is done.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for fabricating a test pattern wafer suitable for CMP characterization, comprising:
   providing a silicon substrate;
   depositing a layer of oxide over a fist surface of the silicon substrate;
   defining a test pattern structure over a surface of the layer of oxide, the defining including selecting from a plurality of test pattern geometries, densities and complexities of features, and using an appropriate test pattern mask to arrange the selected features in a test pattern die;
   fabricating the test pattern structure over the layer of oxide;
   characterizing a CMP process using the test pattern wafer; and
   removing the test pattern structure and the oxide layer from the silicon substrate.

2. A method for fabricating a test pattern wafer suitable for CMP characterization as recited in claim 1, wherein the removing of the test pattern structure and the oxide layer from the silicon substrate allows the wafer to be reclaimed and used for subsequent test pattern wafer fabrication.

3. A method for fabricating a test pattern wafer suitable for CMP characterization as recited in claim 1, wherein the fabricating the test pattern structure includes making simulated transistor features in and over the layer of oxide, and depositing a layer of high density plasma fill over the simulated transistor features.

4. A method for fabricating a test pattern wafer suitable for CMP characterization as recited in claim 3, wherein the characterizing of the CMP process includes measuring a rate of removal of the high density plasma fill, measuring a thickness of simulated transistor features, and evaluating a degree of precision of the CMP process.

5. A method for reclaiming a silicon substrate for repeated chemical mechanical polishing (CMP) characterization, comprising:
   forming a sacrificial oxide layer over the silicon substrate;
   forming test features in the sacrificial oxide layer;
   etching shallow trench isolation (STI) trenches in the sacrificial oxide layer;
   depositing high density plasma in the STI trenches and over the test features;
   performing CMP characterization using the test features, the test features providing data regarding CMP performance; and
   stripping the sacrificial oxide layer including the test features, the stripping enabling reuse of the silicon substrate for the repeated CMP characterization.

6. A method for reclaiming a silicon substrate for repeated chemical mechanical polishing (CMP) characterization as recited in claim 5, wherein the performing of the CMP characterization includes removing the high density plasma from over the test features using a CMP process, and measuring performance indicators of the CMP process during the removing.

7. A method for reclaiming a silicon substrate for repeated chemical mechanical polishing (CMP) characterization as recited in claim 6, wherein the performance indicators include a rate of removal of the high density plasma, a thickness of the test features after the CMP process, and a surface planarity of a resulting surface over the test features.

8. A method for reclaiming a substrate for repeated chemical mechanical polishing (CMP) characterization, comprising:
   forming a sacrificial oxide layer over the substrate, the oxide layer being configured to act as a silicon substrate;
   forming test features into the sacrificial oxide layer, the test features designed to simulate transistor structures and including shallow trench isolation (STI) structures, the STI structures including STI trenches etched into the sacrificial oxide layer;
   performing CMP characterization of the test features, the test features providing data regarding CMP performance over the simulated transistor structures; and
   stripping the sacrificial oxide layer including the test features, the stripping enabling reuse of the substrate for the repeated CMP characterization without damage to the substrate.

9. A method for reclaiming a substrate for repeated chemical mechanical polishing (CMP) characterization as recited in claim 8, wherein the sacrificial oxide layer is formed to a depth of about 2000 Å–5000 Å, and configured to preserve a structure and an integrity of the substrate.

10. A method for reclaiming a substrate for repeated chemical mechanical polishing (CMP) characterization as recited in claim 8, further comprising depositing high density plasma into the STI trenches.

11. A method for reclaiming a substrate for repeated chemical mechanical polishing (CMP) characterization as recited in claim 10, wherein the CMP characterization of the test features includes removing an overburden of high density plasma until the high density plasma in the STI trenches forms a planar surface with a top surface of the simulated transistor structures.

12. A method for reclaiming a substrate in chemical mechanical polishing (CMP) characterization of simulated transistor structures, comprising:

forming a sacrificial layer over the substrate, the layer being configured to structurally simulate a silicon substrate;

forming simulated transistor structures using the sacrificial layer, the using the sacrificial layer including forming shallow trench isolation (STI) trenches in the sacrificial layer to a death of about 3000 Å–4000 Å;

performing CMP characterization of the simulated transistor structures, the characterization providing data regarding CMP performance over the simulated transistor structures; and stripping the sacrificial layer including the simulated transistor structure, the stripping enabling reclaiming of the substrate for repeated CMP characterization;

wherein the reclaiming enables forming of additional sacrificial layers, forming of additional simulated transistor structures, performing of additional CMP characterization, and additional stripping.

13. A method for reclaiming a substrate in chemical mechanical polishing (CMP) characterization of simulated transistor structures as recited in claim 12, wherein the simulated transistor structures include simulated transistor gate structures, the simulated transistor gate structures being formed with at least one layer of silicon nitride.

14. A method for reclaiming a substrate in chemical mechanical polishing (CMP) characterization of simulated transistor structures as recited in claim 13, wherein the simulated transistor structures are formed in a plurality of structure densities, structure complexities, and structure geometries.

15. A method for reclaiming a substrate in chemical mechanical polishing (CMP) characterization of simulated transistor structures as recited in claim 14, wherein the data regarding CMP performance includes a rate of removal, a depth of the at least one layer of silicon nitride, and a degree of planarization of a resulting surface over the simulated transistor structures.

16. A method for fabricating a test pattern wafer for repeated chemical mechanical polishing (CMP) characterization, comprising:

forming a sacrificial oxide layer over a silicon substrate, the sacrificial oxide layer being configured to act as the silicon substrate;

forming test features into the sacrificial oxide layer, the test features formed to simulate semiconductor structures;

performing CMP characterization of the test features, the test features providing data regarding CMP performance over the simulated semiconductor structures; and stripping the sacrificial oxide layer including the test features from the test pattern wafer, the stripping enabling reuse of the silicon substrate for subsequent fabrication of a new test pattern wafer and repeated CMP characterization without damage to the silicon substrate, wherein the forming of the test features includes selecting from a plurality of test pattern geometries, densities and complexities of features, and using an appropriate test pattern mask to arrange selected features in a test pattern die.

17. A method for fabricating a test pattern for repeated chemical mechanical polishing (CMP) characterization as recited in claim 16, wherein the test features include shallow trench isolation trenches and simulated transistor gate structures.

18. A method for fabricating a test pattern wafer for repeated chemical mechanical polishing (CMP) characterization as recited in claim 16, wherein the test features include one or a combination of tungsten plugs, copper patterns, and interlayer dielectrics.

* * * * *